United States Patent [19]

Babu et al.

[11] Patent Number: 4,718,972

[45] Date of Patent: Jan. 12, 1988

[54] METHOD OF REMOVING SEED PARTICLES FROM CIRCUIT BOARD SUBSTRATE SURFACE

[75] Inventors: Suryadevara V. Babu, Potsdam; William F. Herrmann, Endicott; Joseph G. Hoffarth, Binghamton; Voya Markovich, Endwell; Robert T. Wiley, Binghamton, all of N.Y.

[73] Assignee: International Business Machines Corporation, Armonk, N.Y.

[21] Appl. No.: 822,216

[22] Filed: Jan. 24, 1986

[51] Int. Cl.⁴ .................. H05K 3/18; H05K 3/22; B05D 3/04
[52] U.S. Cl. .................. 156/628; 156/643; 156/656; 427/98; 427/306; 430/314; 134/2; 134/26; 134/29
[58] Field of Search .............. 156/628, 643, 646, 656, 156/664; 427/38–40, 98, 259, 264, 306, 305, 404; 430/313, 314, 318, 319, 329, 331; 134/2, 26, 29

[56] References Cited

U.S. PATENT DOCUMENTS

| | | | |
|---|---|---|---|
| Re. 30,505 | 2/1981 | Jacob | 156/643 |
| 3,867,216 | 2/1975 | Jacob | 156/643 |
| 3,971,684 | 7/1976 | Muto | 156/643 |
| 4,253,907 | 3/1981 | Perry et al. | 156/643 |
| 4,430,154 | 2/1984 | Stahl et al. | 156/651 |
| 4,448,804 | 5/1984 | Amelio et al. | 427/98 |
| 4,478,883 | 10/1984 | Bupp et al. | 427/97 |
| 4,554,182 | 11/1985 | Bupp et al. | 427/304 |
| 4,555,303 | 11/1985 | Legge et al. | 156/643 |
| 4,568,562 | 2/1986 | Phillips | 427/40 |
| 4,576,743 | 3/1986 | Kita et al. | 430/331 X |
| 4,610,910 | 9/1986 | Kawamoto et al. | 427/98 X |

Primary Examiner—S. Leon Bashore
Assistant Examiner—Andrew J. Anderson
Attorney, Agent, or Firm—Harness, Dickey & Pierce

[57] ABSTRACT

A method of making a printed circuit board is disclosed wherein metallic seed particles are applied to a surface of the substrate. An image of the desired conductor pattern is defined by a maskant layer to permit the subsequent electroless deposition of the conductor material upon the exposed seeded areas of the substrate. Then, the substrate surface is subjected to a plasma discharge to facilitate removal of the seed particles.

8 Claims, 8 Drawing Figures

FIG. 1.
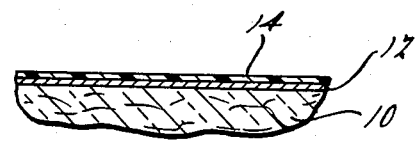
FIG. 2.
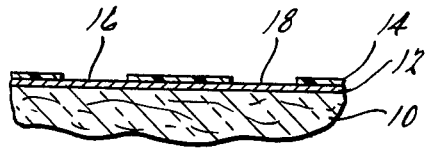
FIG. 3.
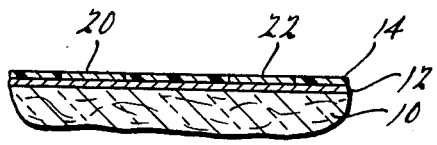
FIG. 4.
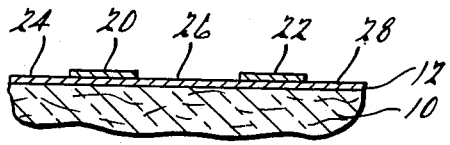
FIG. 5.
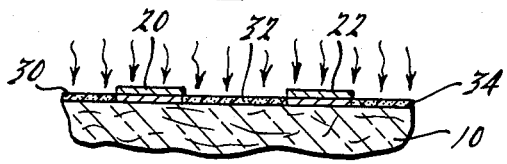
FIG. 6.
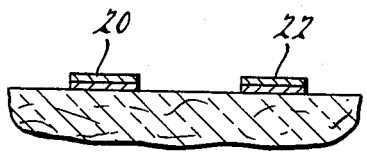
FIG. 7.
```
Apply Seed Particles
To Substrate
       ↓
Coat With
Photoresist
       ↓
Selectively Expose
Seeded Areas
       ↓
Deposit Conductor
Material
       ↓
Remove
Photoresist
       ↓
Subject To
Plasma Discharge
       ↓
Wash In
Solvent
```
FIG. 8.

METHOD OF REMOVING SEED PARTICLES FROM CIRCUIT BOARD SUBSTRATE SURFACE

BACKGROUND OF THE INVENTION

1. Technical Field

This invention relates to a method for making printed circuit boards and the like. More particularly, it involves a method of making circuit boards wherein conductor material is electrolessly deposited onto seeded areas on a dielectric substrate.

2. Background Art

In the manufacture of printed circuit boards and the like, a conductive circuit pattern is provided on at least one surface of a dielectric substrate. The conductor pattern can be formed on the substrate using a variety of known techniques. One of the better known techniques includes the electroless direct bond (EDB) technique where copper is electrolessly plated directly onto the surface of the substrate in the desired pattern. The conductor pattern may include conductor lines on the surface of the substrate as well as in holes (often referred to as plated through holes) which connect one or more conductive layers together. Since the dielectric substrate is non-conductive, it is generally necessary to seed or catalyze the substrate prior to deposition of the metal onto the substrate. Among the more widely employed procedures for seeding the substrate is to deposit colloidal particles of palladium (Pd) and tin (Sn) on the substrate. A copper metallic coating can then be applied to the seeded areas by way of well known electroless deposition techniques.

U.S. Pat. No. 4,448,804 to Amelio et al, which is assigned to the assignee of the present invention, discloses a particularly advantageous technique for making printed circuit boards and the like. Briefly, that patent discloses the steps of coating a previously seeded substrate with a maskant such as a photoresist. The photoresist is then developed leaving exposed those seeded areas which correspond to the desired conductor pattern. Copper is then electrolessly plated onto the substrate and the remaining photoresist is removed.

While the process noted above has provided extremely satisfactory results, electrical shorts between the conductor lines on the substrate have been occasionally experienced. Of course, such problems are to be avoided if at all possible.

SUMMARY OF THE INVENTION

The broad teachings of the present invention stem from the observation that the metallic seed particles that remain on the substrate surface may cause undesirable electrical shorting between the various conductor lines on the substrate. According to the teachings of this invention, once the maskant layer is removed during the aforementioned processing steps, the substrate is then subjected to a plasma discharge. The plasma is preferably produced from a mixture of gases which react with the metallic seed particles to aid in their removal. Preferably, the gas mixture includes oxygen and a halo-carbon where the metallic seed particles comprise palladium and tin. In a particularly advantageous embodiment, the plasma discharge step is followed by washing the substrate in a solvent.

In the preferred embodiment, the present invention involves a method of making printed circuit boards which includes the steps of:

(a) applying metallic seed particles on a surface of a dielectric substrate;
(b) coating the substrate surface with a maskant layer;
(c) selectively removing portions of the maskant to expose seeded areas on the substrate desired for conductor formation;
(d) forming metallic conductors on the exposed seeded areas by electroless deposition;
(e) removing the remaining maskant;
(f) subjecting the substrate to a plasma discharge; and
(g) washing the substrate in a solvent to remove the seed particles from the substrate.

BRIEF DESCRIPTION OF THE DRAWINGS

The various advantages of the present invention will become apparent to one skilled in the art upon reading the folowing specification and by reference to the drawings in which:

FIGS. 1-7 are partial cross-sectional views which schematically illustrate sequential processing steps according to the teachings of the preferred embodiment of the present invention; and FIG. 8 is a flow chart arranged so that the boxes therein generally relate to the steps performed on the substrate as illustrated in the adjacent FIGS. 1-7.

DESCRIPTION OF THE PREFERRED EMBODIMENT

The method of the present invention is applicable to forming printed circuit patterns on a wide variety of dielectric substrates including thermoplastic and thermosetting resins, glass and ceramics. Typical thermosetting polymeric materials include epoxy, phenolic base materials, and polyimides. The dielectric substrate may be molded from the polymers and may contain fillers and/or reinforcing agents. Presently preferred substrates include glass reinforced epoxy resin materials. Suitable thermoplastic polymeric materials include polyolefins such as polypropylene, polysulfones, polycarbonates, and other suitable materials.

The first general step as illustrated in FIG. 1 is to apply a layer 12 of metallic seed particles onto the substrate 10. Preferably, the seed particles are collodial particles of palladium and tin which are applied in the manner disclosed in the aforementioned U.S. Pat. No. 4,448,804 to Amelio et al which is hereby incorporated by reference. Briefly, a copper sheet is laminated to the substrate surface and the copper later etched away. The etched surface of the substrate is conditioned by bringing it into contact with an acidic solution containing a multi-functional cationic group containing at least two available cationic moities. The surface of the substrate is activated or seeded by bringing it into contact with at least one solution containing stannous and/or palladium chloride. The substrate is then rinsed with distilled water, with the activated surface being then brought into contact with an aqueous solution of HCL. The HCL treated surface is then rinsed with the de-ionized water.

Although seed particles of palladium and tin are presently preferred, it is expected that seed particles selected from the periodic group of VIII, and IVA may also be used in accordance with the method of this invention. It should also be understood that a wide variety of different methods for seeding the substrate surface may also be used as should be apparent to the skilled practioner.

The next general step (see FIG. 2) is to apply a layer 14 of maskant, such as photoresist, onto the seeded substrate. The maskant layer 14 can be applied by a variety of methods such as by spin coating. Preferably, however, the maskant layer takes the form of a negative photoresist film which is laminated onto the substrate surface.

As shown in FIG. 3, the next step is to selectively expose areas of the seeded substrate which are desired for conductor formation. These areas are schematically shown bearing reference numerals 16 and 18. This is conveniently accomplished by exposing the photoresist layer 14 through an appropriate mask. Through subsequent developing in a known manner, the negative of the desired pattern is produced in the photoresist layer 14. In the areas 16, 18 where the photoresist layer has been removed, the seeded or catalyzed regions of the substrate are exposed.

The exposed seeded areas 16, 18 are next plated using conventional electroless plating techniques such as those disclosed in the aforementioned U.S. Pat. No. 4,448,804. The plated copper is illustrated in FIG. 4 as conductor lines 20 and 22. Electroless copper plating techniques are well known in the art and may be used in accordance with this invention. Preferably, the plating is done in two steps differing in the composition baths used and in the duration of the steps as more fully disclosed in the referenced U.S. Pat. No. 4,448,804.

As illustrated in FIG. 5, the next step is to remove the photoresist layer 14. This is conventionally done by stripping the photoresist preferably with methylene chloride or a similar solvent which is selectively reactive with the developed photoresist.

As can be seen in FIG. 5, there unfortunately remains some seed particles in the areas 24, 26 and 28 of the substrate which are located between the conductors 20, 22. While the thickness of the seeded layer 12 has been exaggerated in the drawings, it has been discovered that a sufficient number of the seed particles can remain on the surface of the substrate that can result in creating electrical shorts between the conductors 20,22. According to the present invention, the seed particles are removed by subjecting the substrate to a gas plasma discharge designed to react with the particles.

The plasma discharge step is shown schematically in FIG. 6. Preferably, the plasma discharge treatment is carried out in a batch process wherein a plurality of similarly processed substrates are placed in a holder in a reactor chamber. The reactor chamber includes an inlet for introducing gas into the chamber for producing the plasma therefrom. A source of radio frequency (RF) power provides the exciting energy to electrodes located in the reaction chamber. Typically, the RF power employed is between 0.02 and 0.1 (watt per square centimeter of electrode area) continuous radiation at a frequency in the megahertz range. By way of a non-limiting example, the reactor and related equipment is commercially available from Branson International Plasma Corporation of Hayward, Calif.

The gas introduced into the reaction chamber (from which a plasma is produced from the RF energy), is preferably a mixture of oxygen and a halocarbon. Where the seed particles are palladium and tin, suitable halocarbons include tetrafluoromethane ($CF_4$) and chlorotrifluoromethane ($CClF_3$) and related chlorofluoromethanes. The presently preferred plasma gas is a mixture of $O_2$ and $CF_4$ in the ratio of 60 to 90 percent oxygen to halocarbon by volume.

By way of a specific example, a flow of a mixture of 70 percent by volume oxygen and 30 percent by volume $CF_4$ is established through the reactor chamber at a rate of about 1.0 to 4.0 standard liters per minute. The other end of the vacuum chamber is connected to a vacuum pump which maintains the pressure within the chamber at about 300 millitorr. An RF frequency of about 13.5 megahertz is established to create a "cold" plasma therein. The substrates remain in the chamber for about 8 to 20 minutes, with 12 minutes being presently preferred. Then, the substrates are removed from the chamber.

The exact processing parameters may be suitably varied in a manner which will be apparent to the skilled practitioner having the benefit of the teachings of this patent. However, it is believed that the percent by volume of oxygen should be no more than 90 percent because of loss of conversion of atomic state. On the other hand, it should be no less than 60 percent because of reduced reaction rates. The pressure in the reactor should be between 100 and 400 millitorr because of current reactor design limitations. The temperature in the reactor should be between 25 degrees C. and preferably no higher than 140 degrees C. because thermal degradation of polymeric substrates can occur at higher temperatures. The time that the substrate is exposed to the plasma should be 8 to 20 minutes to provide sufficient time for conversion from the metallic state to the ionic state and minimize material degradation.

It is believed that the fluorine and oxygen containing radicals in the plasma will react with the palladium and tin seed particles to thereby form the salts thereof; namely: palladium fluoride and stannous fluoride and their oxides, respectively. The converted regions of the substrate is shown schematically in FIG. 6 in the areas bearing reference numerals 30, 32 and 34. Some of the palladium and tin particles may be volatized and removed in the main gas stream to the vacuum pump.

The final step as represented in FIG. 7 is to wash the substrate in a solvent. It has been discovered that by washing the substrate in suitable alkaline or acidic solutions that the metallic seed particles are removed from the areas 30, 32 and 34 between the conductors 20, 22. Suitable alkaline solvents include solutions of caustic soda, potassium hydroxide, and sodium silicate. Acidic solutions such as hydrochloric and nitric or sulfuric acids in proper strengths can be used. However, alkaline solvents are preferred because they will not attack the copper conductors 20, 22 but will selectively dissolve the salts of palladium and tin which were created during the plasma discharge step. Without the plasma discharge step, it is extremely difficult to remove the palladium and tin seed particles since they are in their free metal state and not readily soluable in solvents that will not adversely affect the conductor pattern on the substrate. By way of a particular example, the substrates can be washed by rinsing them in a bath containing a 5–50% by volume solution of caustic soda for about 3 minutes.

In view of the foregoing, those skilled in the art can appreciate that the present invention provides significant advantages in removing seed particles from the surfaces of circuit board substrates. While this invention has been described in connection with a particular example thereof, various other modifications will become apparent to the skilled practitioner upon a study of the specification, drawings and following claims.

What is claimed is:

1. A method of making a printed circuit board comprising the steps of:

(a) applying metallic seed particles onto a surface of a dielectric substrate;
(b) applying a maskant layer onto the substrate surface over the seed particles;
(c) selectively removing portions of the maskant layer to expose seeded areas on the substrate desired for conductor formation;
(d) electrolessly depositing metallic conductors on the exposed seeded areas on the substrate;
(e) removing the remaining maskant;
(f) subjecting the substrate surface to a plasma discharge formed from a gaseous mixture comprised of oxygen and a halocarbon to convert the metallic seed particles to their salt forms; and
(g) washing the substrate in a solvent which effectively removes said seed particles converted to their salt form from the substrate surface but does not adversely affect the desposited conductors.

2. The method of claim 1 wherein the seed particles comprise palladium and tin.

3. The method of claim 2 wherein said halocarbon is selected from the group of tetrafluoromethane ($CF_4$) and chlorotrifluoromethane ($CClF_3$).

4. The method of claim 3 wherein the solvent is an alkaline solvent.

5. The method of claim 4 wherein the alkaline solvent is selected from the group of caustic soda, potassium hydroxide and sodium silicate.

6. A method of making a printed circuit board comprising the steps of:
(a) depositing collodial seed particles of palladium and tin on a surface of an epoxy resin substrate;
(b) coating the seeded substrate surface by laminating a photoresist foil onto the surface;
(c) selectively removing portions of the photoresist to expose seeded areas on the substrate desired for conductor formation;
(d) electrolessly depositing copper onto the exposed seeded areas to thereby form electrical conductors on the substrate surface;
(e) removing remaining portions of the photoresist;
(f) exposing the substrate to a gaseous plasma formed in a radio frequency field from a mixture consisting of oxygen and a halocarbon for a sufficient period of time to convert the palladium and tin seed particles into their respective salt forms; and
(g) washing the substrate in a 5–50% by volume solution of caustic soda to remove the seed particles that have been converted to their salt forms by said plasma whereby the removal of the seed particles substantially decreases the likelihood of electrical shorts occurring between the conductors.

7. The method of claim 6 wherein the halocarbon is selected from the group of tetrafluoromethane ($CF_4$) and chlorotrifluoromethane ($CClF_3$).

8. In a method of making a printed circuit board wherein metallic conductors are electrolessly deposited on a metallic particle seeded dielectric substrate surface, the improvement comprising the steps of:
subjecting the substrate to a gas plasma formed from a mixture consisting of oxygen and a halocarbon to convert the metallic seed particles to their salt forms; and
thereafter, washing the substrate in an alkaline solution which effectively removes said seed particles converted to their salt form from the substrate surface between the conductors but does not adversely affect the conductors.

* * * * *